United States Patent
Chandhok et al.

(10) Patent No.: US 10,678,137 B2
(45) Date of Patent: Jun. 9, 2020

(54) MULTI-PASS PATTERNING USING NONREFLECTING RADIATION LITHOGRAPHY ON AN UNDERLYING GRATING

(71) Applicant: Intel Corporation, Santa Clara, CA (US)

(72) Inventors: Manish Chandhok, Beaverton, OR (US); Todd R. Younkin, Cary, NC (US); Sang H. Lee, Saratogoa, CA (US); Charles H. Wallace, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 467 days.

(21) Appl. No.: 15/504,469

(22) PCT Filed: Sep. 22, 2014

(86) PCT No.: PCT/US2014/056761
§ 371 (c)(1),
(2) Date: Feb. 16, 2017

(87) PCT Pub. No.: WO2016/048264
PCT Pub. Date: Mar. 31, 2016

(65) Prior Publication Data
US 2017/0235228 A1 Aug. 17, 2017

(51) Int. Cl.
*H01L 21/768* (2006.01)
*G03F 7/20* (2006.01)
*H01L 21/033* (2006.01)
*H01L 21/311* (2006.01)
*H01L 21/027* (2006.01)
*G03F 7/00* (2006.01)
*G03F 7/09* (2006.01)

(52) U.S. Cl.
CPC ............ *G03F 7/70* (2013.01); *G03F 7/0035* (2013.01); *G03F 7/094* (2013.01); *G03F 7/2039* (2013.01); *G03F 7/70466* (2013.01); *H01L 21/0273* (2013.01); *H01L 21/0274* (2013.01); *H01L 21/0277* (2013.01); *H01L 21/0332* (2013.01); *H01L 21/31144* (2013.01); *H01L 21/76816* (2013.01)

(58) Field of Classification Search
CPC .............. G03F 7/0035; G03F 7/70466; G03F 7/70458; H01L 21/0277
See application file for complete search history.

(56) References Cited

U.S. PATENT DOCUMENTS

| | | |
|---|---|---|
| 6,667,237 B1 | 12/2003 | Metzler |
| 9,041,217 B1 | 5/2015 | Bristol et al. |
| 2009/0246706 A1 | 10/2009 | Hendel et al. |
| 2012/0009529 A1 | 1/2012 | Hatakeyama |
| 2014/0272711 A1 | 9/2014 | Bristol et al. |

FOREIGN PATENT DOCUMENTS

| | | |
|---|---|---|
| CN | 105793977 | 7/2019 |
| JP | 2005275386 | 10/2005 |
| JP | 2010171039 | 8/2010 |
| JP | 5204410 | 6/2013 |
| JP | 2014135417 | 7/2014 |
| KP | 1020010017089 | 3/2001 |
| WO | 2015094488 | 6/2015 |

OTHER PUBLICATIONS

Yamamoto, H. et al., "Reaction Mechanism of Fluorinated Chemically Amplified Resists", Journal of Vacuum Science & Technology B: Microelectronics and Nanometer Structures Processing, Measurement, and Phenomena 24, 1833 (2006); doi: 10.1116/1.2214711.
International Search Report & Written Opinion dated Jul. 23, 2015 for PCT Patent Application No. PCT/US2014/056761.
Extended European Search Report for European Patent Application No. 14902548.8, dated Apr. 26, 2018.
Notification of Reasons for Refusal for Japan Patent Application No. 2017-508654, dated Jul. 30, 2018.
Non-Final Office Action received for Chinese Patent Application No. 201480081348.6 dated Oct. 28, 2019.

*Primary Examiner* — Daborah Chacko-Davis
(74) *Attorney, Agent, or Firm* — Green, Howard & Mughal LLP

(57) ABSTRACT

Techniques related to multi-pass patterning lithography, device structures, and devices formed using such techniques are discussed. Such techniques include exposing a resist layer disposed over a grating pattern with non-reflecting radiation to generate an enhanced exposure portion within a trench of the grating pattern and developing the resist layer to form a pattern layer having a pattern structure within the trench of the grating pattern.

18 Claims, 10 Drawing Sheets

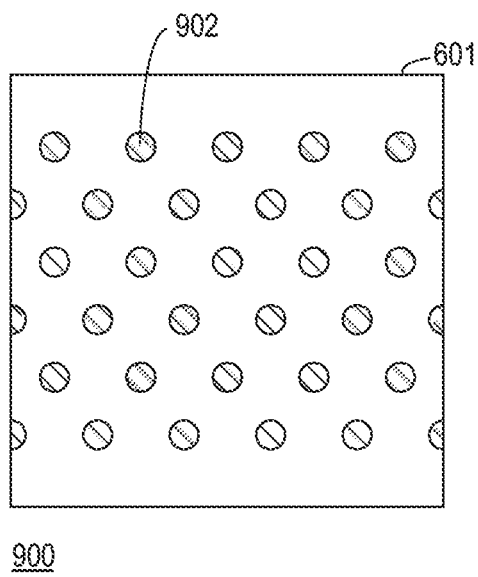
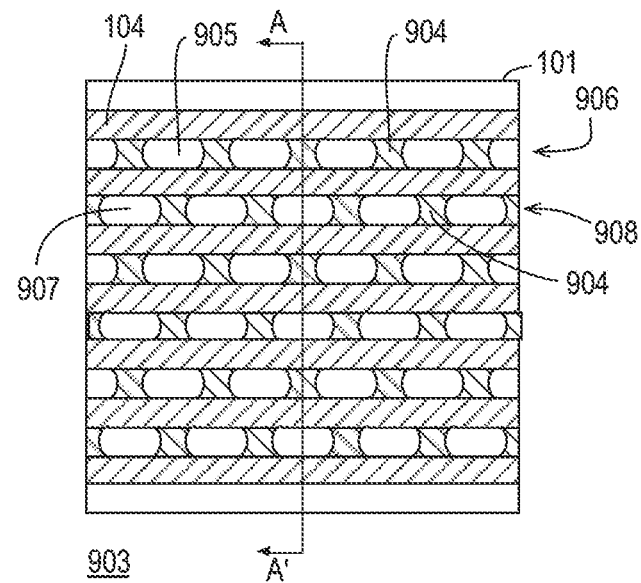
FIG. 9A  FIG. 9B
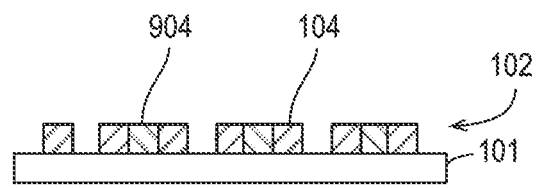
FIG. 9C

MULTI-PASS PATTERNING USING NONREFLECTING RADIATION LITHOGRAPHY ON AN UNDERLYING GRATING

CLAIM OF PRIORITY

This Application is a National Stage Entry of, and claims priority to, PCT Application No. PCT/US14/56761, filed on 22 Sep. 2014 and titled "MULTI-PASS PATTERNING USING NON-REFLECTING RADIATION LITHOGRAPHY ON AN UNDERLYING GRATING", which is incorporated by reference in its entirety for all purposes.

TECHNICAL FIELD

Embodiments of the invention generally relate to multi-pass patterning lithography techniques and more particularly relate to multi-pass patterning using non-reflecting radiation to form pattern structures within trenches of an underlying grating pattern, and device structures and devices formed using such techniques.

BACKGROUND

Scaling integrated circuit structures such as device structures and interconnect structures may be limited by the capability of lithography techniques to reliably resolve such transistor and interconnect structures. In some implementations, extreme ultraviolet (EUV) lithography may be used to pattern (e.g., via a resist layer) such structures. However, EUV lithography may have low throughput due to low power sources used for generating EUV photons. One solution is to provide resist (e.g., photoresist) with a higher photospeed (e.g., such that the resist may be patterned at lower power). However such resists tend to have poor pattern fidelity due to shot noise (e.g., low fidelity due to fewer photons doing the work of patterning the resist).

In other implementations, multiple patterning techniques such as multi-pass patterning techniques may be used to provide smaller pattern structures. Such techniques may include dual tone resist techniques, double exposure of the same resist layer, double expose/double etch techniques, or multi-pass patterning techniques using an underlying grating. For example, multi-pass patterning techniques using an underlying grating pattern may include forming a grating pattern and forming a second pattern layer over the grating pattern. Such multi-pass patterning techniques using an underlying grating pattern may rely on scumming to anchor the second pattern layer within the grating pattern for example. For example, some integration schemes based on 193 nanometer (nm) lithography and multi-pass patterning may rely on gratings that are cut or blocked by planarizing multi-layer stacks to generate a final pattern of interest. Such techniques may suffer from low pattern fidelity and a small process window (e.g., depth of focus, exposure latitude, etc.) and pattern placement errors that make alignment to the underlying grating difficult and cost-prohibitive.

As such, there is a continual effort to achieve smaller pattern features with high fidelity, repeatability, and manufacturing tolerances that allow effective low cost manufacturing. Such efforts may become critical as smaller feature sizes are desired.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIG. 9A is a plan view of an example pattern layers on a flat substrate layer;

FIG. 9B is a plan view of an example final overlaid pattern;

FIG. 9C is a cross-section of the example final overlaid pattern of FIG. 9B;

DETAILED DESCRIPTION

Figure 1A:
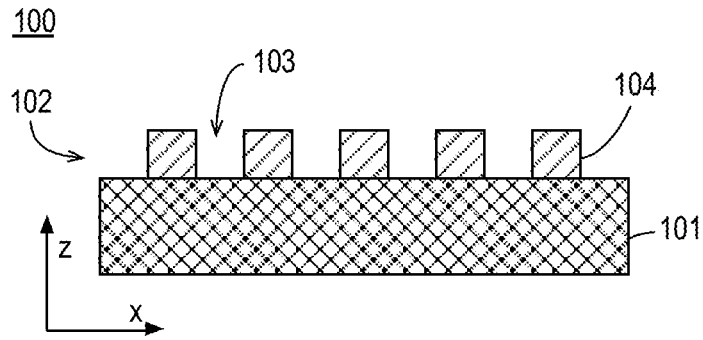
FIGS. 1A, 1B, 1C, and 1D are side views of example device structures as particular fabrication operations are performed.
Figure 1B:
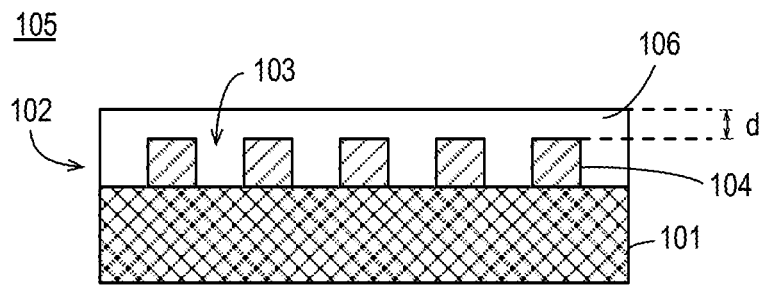

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized and structural and/or logical changes may be made without departing from the scope of claimed subject matter. It should also be noted that directions and references, for example, up, down, top, bottom, over, under, and so on, may be used to facilitate the discussion of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Methods, device structures, devices, apparatuses, and computing platforms, are described below related to multi-pass patterning using non-reflecting radiation lithography on an underlying grating pattern.

As described above, there is a continual effort to achieve smaller pattern features with high fidelity, repeatability, and manufacturing tolerances that allow effective low cost manufacturing. As is discussed further herein, in an embodiment, a grating pattern having trenches interspersed among line features may be disposed on a device layer. In various examples, the grating pattern may include rows of trenches interspersed among rows of line features, rectangular or square trenches interspersed among intersections of orthogonal line features, or other grating patterns. For example, the grating pattern may be formed using 193 nm lithography or other suitable process such that the gating pattern may be a resist material. As used herein, 193 nm lithography is meant to include 193 nm lithography implemented with or without immersion techniques. In other examples, a pattern may be transferred to a hardmask layer such that the grating pattern may be a hardmask material such as an oxide, a nitride, a carbide, a silicide, a metallic oxide, a metallic nitride, or the like. In yet other examples, the grating pattern may be formed using self-aligned spacer techniques such that a sub-resolution grating pattern may be formed. In still further examples, the techniques discussed herein may be used to generate a grating pattern. The grating pattern may include a single material (e.g., color) or multiple colors. For example, a grating pattern including rows of trenches interspersed among rows of line features may have line features alternating colors, having every third line feature being a different color, having every fourth line feature being a different color, and so on. Furthermore, grating patterns having more patterns such as trenches interspersed among orthogonal intersecting line features may include line features having all the same color, line features in one or both direction having alternating colors, line features in one or both directions having every third line feature being a different color, and so on.

A resist layer may be disposed over the grating pattern using a spin-on technique for example. The resist layer may be exposed with a non-reflecting radiation to generate enhanced exposure portions of the resist layer within a trench of the grating pattern. For example, the enhanced exposure portions may be fully within a trench or within multiple trenches. In some examples, enhanced exposure portions may be contiguous with exposed portions extending over and across one or more line features of the grating pattern. As used herein non-reflecting radiation may be any fully or substantially non-reflecting radiation. For example, non-reflecting radiation may include electromagnetic radiation having a wavelength of not more than 120 nm such as EUV radiation. In other examples, non-reflecting radiation may include electron-beam (e.g., e-beam) radiation. For example, non-reflecting radiation may be used such that underlying anti-reflecting materials or material stacks may not be needed.

As discussed, an enhanced exposure portion may be formed within a trench of the grating pattern upon exposure of the resist. For example, exposure of the resist may chemically alter the resist such that the resist becomes more soluble (e.g., positive resist) or less soluble (e.g., negative resist) in developer. In some examples, such enhanced exposure portions may harvest or utilize secondary electrons to further chemically alter the resist to become more or less soluble in developer. For example, EUV photons may be highly ionizing and the sensitization mechanism for EUV resist may be by or enhanced by secondary electrons generated during exposure. Such techniques may reduce the number of EUV photons needed to expose the EUV resist. In some examples, such secondary electrons may be harvested or contained within grating pattern trenches to enhance EUV exposure. The exposed resist may be developed to form a pattern layer having a pattern structure within a trench of the grating pattern. In some examples, the pattern structure may be self-aligned within the trench (e.g., one or both edges of the pattern structure may be self-aligned with in the trench). The pattern layer may include additional pattern structures such that features may be defined for the device being fabricated. For examples, grids or lines of vias may be defined based on the grating pattern and the pattern layer. In other examples, lines or trenches may be defined based on the grating pattern and the pattern layer.

As discussed, a grating pattern having trenches interspersed among line features may be formed on a device layer. The device layer may include any suitable materials and/or features for forming a device structure. For example, the device layer may include crystalline silicon for the formation of device channels. In other examples, the device layer may include transistor devices that may be contacted by vias or contacts or transistor devices already contacted by contact plugs, which may be interconnected by metal lines or the like. Furthermore, as discussed, a pattern layer may be disposed over the grating layer and the device layer such that the pattern layer includes a pattern structure on the device layer and within a trench of the grating pattern. In some examples, the pattern layer may include additional pattern structures having a gap or gaps therebetween such that vias may be defined at intersections of trenches in the grating pattern and gap(s) in the pattern layer. Such vias may be used as an etch mask to provide contact holes or via holes to structures within the device layer such that metal plugs or the like may be provided, for example. In some examples, the features provided by the grating pattern and the pattern layer may provide sub-resolution features having pattern fidelity (e.g., such that the features may be properly resolved and may be repeated across the pattern). Such sub-resolution features, for example, may be features that are not attainable via printing resist disposed a flat substrate using conventional 193 nm or EUV lithography. In some examples, such sub-resolution features may be vias having feature sizes not greater than 20 nm and/or vias resolved to a 40 nm half-pitch. In some examples, such sub-resolution features may be lines or trenches having feature sizes not greater than 11 nm and/or lines or trenches resolved to a 22 nm half-pitch.

The techniques discussed herein may provide simplified multi-patterning methods that do not require anti-reflective layers used in prior methods and may thereby reduce processing steps and complexity. Such advantages may offer reduced cost and defect density in generating the final pattern of interest. Furthermore, the techniques discussed herein provide pattern fidelity, resist sensitivity, reduced pattern placement error, and improved overall resolution with relatively broad process windows. For example, the techniques discussed herein may eliminate the use of anti-reflective coatings, eliminate steps associated with removing such anti-reflective coatings (e.g., etch steps, ash steps, cleaning steps, or the like), improve photospeed for blocks/cuts in the pattern layer (e.g. about 30% improvement in photospeed for blocks and cuts and up to 3× photospeed improvement for vias and contacts), improve pattern fidelity, improve pattern layer placement relative to the underlying grating pattern, improve overlay, provide larger depth of focus, improve resolution, and reduce defectivity.

FIGS. 1A, 1B, 1C, and 1D are side views of example device structures as particular fabrication operations are performed, arranged in accordance with at least some implementations of the present disclosure. As shown in FIG. 1A, a device structure 100 may include a device layer 101 and a grating pattern 102 including trenches 103 interspersed among line features 104. For example, device structure 100 may be formed by disposing grating pattern 102 on device layer 101. Device layer 101 may include, for example, a semiconductor material such as crystalline silicon. In other examples, device layer 101 may include previously formed devices, device components, or the like. For example, device layer 101 may include transistors, memories, capacitors, resistors, optoelectronic devices, switches, or any other active or passive electronic devices, or portions thereof. In some examples, device layer 101 may include a partially formed device such as a transistor device. For example, it may be desirable to perform a patterned etch of portions of device layer 101 to contact devices therein or form a metallization pattern or the like. In other examples, it may be desirable to build up a patterned layer or layers over device layer 101 to interconnect devices therein or the like. In some examples, it may be desirable to form a gate over device layer 101. In some examples, device layer 101 may be disposed over a substrate (not shown). In some examples, the substrate may include a semiconductor material such as monocrystalline silicon (Si), germanium (Ge), silicon germanium (SiGe), a III-V materials based material (e.g., gallium arsenide (GaAs)), a silicon carbide (SiC), a sapphire ($Al_2O_3$), or any combination thereof.

Figure 6B:
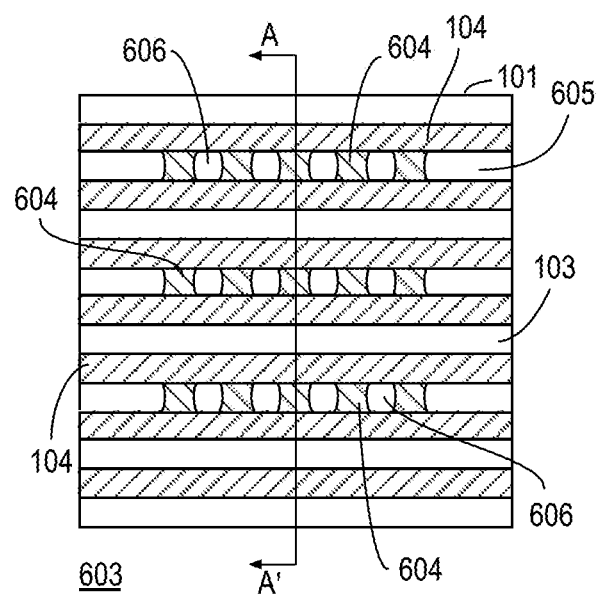
FIG. 6B is a plan view of an example final overlaid pattern.

As discussed, grating pattern 102 may include trenches 103 interspersed among line features 104. In an example, trenches 103 and line features 104 may include rows of trenches 103 interspersed among rows of line features 104 in a substantially 1-dimensional linear grating pattern as is illustrated with respect to FIG. 5 herein. In another example, trenches 103 may be interspersed among substantially orthogonal and intersecting line features 104 such that, for example, trenches 103 may be substantially square, rectangular, round, or the like in shape and such that trenches 103 are at regions of and fully surrounded by intersecting line features 104. For example, FIG. 7B illustrates an example 2-dimensional grid grating pattern that may be formed. In yet other examples, grating pattern 102 may include other potentially more complicated patterns such as a row, rows, or grids of trenches, rows of offset trenches, or the like. For example, FIGS. 6B, 8B, and 9B illustrate example 2-dimensional grating patterns. In some examples, grating pattern 102 may be characterized as a first pattern or a pre-pattern or the like.

Line features 104 of grating pattern 102 may include any suitable material or materials. In some examples, line features 104 may include a resist, an oxide, a nitride, a carbide, a silicide, a dielectric, a metallic oxide, or a metallic nitride. For example, line features 104 may include a hardmask material such as an oxide hardmask, a nitride hardmask, a carbide hardmask, a metallic oxide hardmask, a metallic nitride hardmask, or the like. In some examples, line features 104 may include a stack of materials such as a hardmask stack. Line features 104 may each include the same material or materials or line features 104 may include different materials. For example, a first line feature and a second line feature of line features 104 may include different materials such as any of those listed above. Such structures may be formed, for example, when self-aligned spacer techniques are used to form grating pattern 102 as is discussed further herein and, in particular, with respect to FIGS. 3A-3D. In an example, every other of line features 104 may be different materials (e.g., colors). In other examples, every third, fourth, fifth, sixth, or $N^{th}$ of line features 104 may be a different color. In yet other examples, patterns of line features 104 may be formed having more than two colors. For example, multi-color patterns of line features 104 having two, three, four, or N colors may be formed. Furthermore, as discussed, in some examples, grating pattern 102 may include a 2-dimensional pattern such a grid of orthogonal intersecting line features 104. In such examples, one or both of the orthogonal line features 104 may include multicolor (e.g., two or more) patterns. For example, line features 104 may have a multi-color (e.g., two or more color) pattern as discussed and/or line features extending in the x-direction (not shown) may have a multi-color (e.g., two or more color) pattern. In such examples, if a trench is characterized as being within a box having four line feature walls, the walls could be the same color, two colors, three colors, or four colors in any suitable pattern.

As discussed, device structure 100 may be formed by disposing grating pattern 102 on device layer 101. Grating pattern 102 may be disposed on device layer 101 using any suitable technique or techniques. In some examples, grating pattern 102 may be formed by spinning on a resist layer (e.g., positive or negative photoresist), exposing or patterning the resist layer using lithography techniques, and developing the resist layer to form grating pattern 102. In such examples, grating pattern 102 may be formed using any suitable lithography system such as a 193 nm immersion system, an EUV system, an e-beam system, or the like, with a 193 nm immersion system being particularly advantageous due to throughput considerations in manufacturing environments. Such examples may include single-, double- or multi-pass lithography techniques.

In other examples, a pattern formed using such lithography techniques may be transferred to a hardmask material. For example, a hardmask layer may be formed on device layer 101. Subsequently, a pattern of resist (e.g., positive or negative photoresist) may be formed over the hardmask layer using the discussed spin-on, expose, and develop techniques and the pattern may be transferred to the hardmask layer via etch techniques (e.g., wet etch techniques) or the like. The resist may be removed to leave grating pattern 102 on device layer 101. In yet other examples, grating pattern 102 may be disposed on device layer 101 using self-aligned spacer techniques as discussed herein with respect to FIGS. 3A-3D. Furthermore, the techniques discussed herein may be used to generate grating pattern 102. For example, grating pattern 102 may be formed by providing a first grating pattern, disposing resist over the first grating pattern, exposing the resist layer with non-reflecting radiation to generate an enhanced exposure portion of the resist layer within at least one trench of the grating pattern, and developing the resist layer to form grating pattern 102. In such examples, the techniques discussed herein may be repeated in a multi-pass patterning fashion. Such techniques may be repeated two, three, four, or N number of times to produce a desired pattern.

Figure 5:
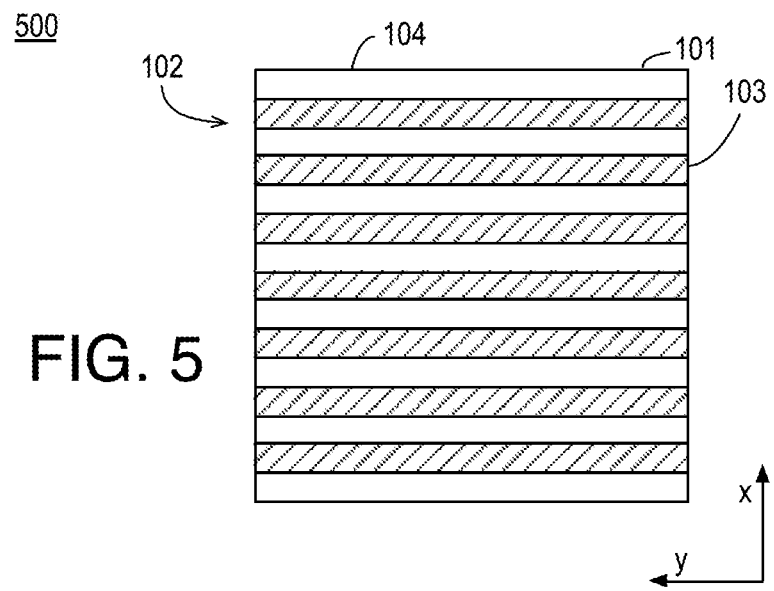
FIG. 5 is plan view of an example grating pattern.

FIG. 5 is plan view 500 of example grating pattern 102, arranged in accordance with at least some implementations of the present disclosure. As shown in FIG. 5, grating pattern 102 may include trenches 103 interspersed among line features 104 and grating pattern 102 may be disposed on device layer 101. In the example of FIG. 5, device layer 101 is shown without cross-hatching for the sake of clarity of presentation. Grating pattern 102 may extend across all areas of device layer 101 or grating pattern 102 may be formed in one or more regions of device layer 101. In an example, device layer 101 may be a portion of a semiconductor wafer such as 300 mm wafer or the like. In such examples, grating pattern 102 may be formed on regions or portions of device layer 101 where the subsequently formed features (e.g., via the final pattern) are desired. In other examples, grating pattern 102 may include a grid pattern or similar pattern as discussed herein.

Returning to FIG. 1B, FIG. 1B illustrates a device structure 105 similar to device structure 100, after the formation of resist layer 106. Resist layer 106 may be formed using any suitable technique or techniques. For example, resist layer 106 may be disposed over grating pattern 102 using spin-on techniques. As shown, a top surface of resist layer 106 may extend above top surfaces of grating pattern 102 (e.g., the top surfaces of line features 104) by a height or distance, d. The distance, d, of the top surface of resist layer 106 over the top surfaces of grating pattern 102 may be any suitable distance. In some examples, the distance, d, of the top surface of resist layer 106 over the top surfaces of grating pattern 102 may facilitate subsequent patterning of resist layer 106 by providing a substantially planar surface. In other examples, the top surface of resist layer 106 and the top surfaces of grating pattern 102 (e.g., the top surfaces of line features 104) may be substantially planar (e.g., d=0). Such examples may provide a more efficient localization of enhanced exposure portions of resist layer 106, as is discussed further herein, and/or better alignment of patterned features with trenches 103.

Figure 1C:
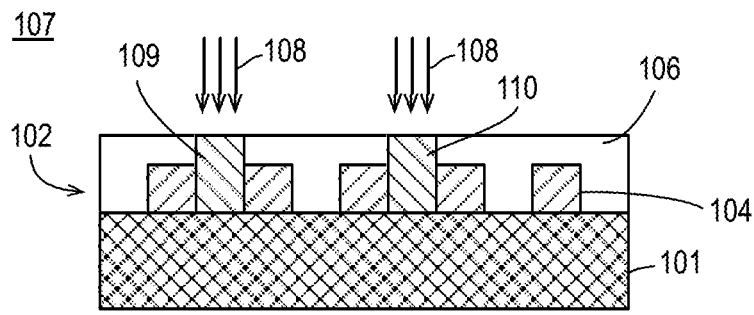

FIG. 1C illustrates a device structure 107 similar to device structure 105, during the exposure of resist layer 106. As shown in FIG. 1C, resist layer 106 may be exposed with radiation 108 to form exposed portions 109, 110 in resist layer 106. In some examples, radiation 108 may be non-reflecting radiation. As used herein non-reflecting radiation may be any fully or substantially non-reflecting radiation. For example, non-reflecting radiation may include electromagnetic radiation having a wavelength of not more than 120 nm such as EUV radiation. In other examples, non-reflecting radiation may include electron-beam (e.g., e-beam) radiation. For example, non-reflecting radiation may be used such that underlying anti-reflecting materials or material stacks may not be needed. As discussed, in some examples, radiation 108 may be non-reflecting EUV radiation. For example, EUV photons may provide highly ionization rates within resist layer 106 (e.g., an EUV photoresist) and the sensitization mechanism for resist layer 106 may be secondary electron generation within resist layer 106. In some examples, trenches within grating pattern 102 may harvest or contain such secondary electrons to provide enhanced exposure portions (e.g., exposed portions 109, 110). Such enhanced exposure portions may provide for lower EUV dosage requirements (e.g., more than 20% less dosage requirements) and a faster photospeed for resist layer 106 such that faster throughput may be achieved. Furthermore, as discussed further herein, features generated using such techniques may snap to substantial alignment with sidewalls of line features 104 even in circumstances of imperfect exposure or alignment with grating pattern 102.

Such advantages may offer wide process windows for the generation of features as discussed herein.

Figure 1D:
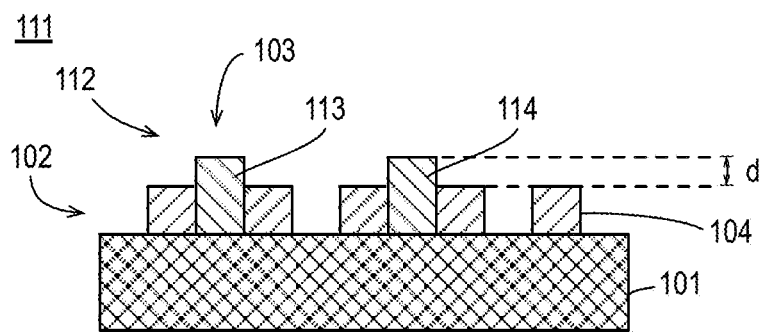

FIG. 1D illustrates a device structure 111 similar to device structure 107, after the develop of resist layer 106. As shown in FIG. 1D, resist layer 106 may be developed to form a pattern layer 112 having pattern structures 113, 114 on device layer 101 and within trenches of grating pattern 102. As shown, in some examples, pattern structures 113, 114 may be disposed directly on device layer 101. FIG. 1D illustrates an example negative resist layer 106. However, positive resists may also be implemented using the discussed techniques. As shown in FIG. 1D, a top surface of pattern structures 113, 114 may be above a top surface of line features 104 by a distance, d, as discussed above with respect to FIG. 1B. In other examples, the top surface of pattern structures 113, 114 may be substantially planar with respect to the top surface of line features 104. As discussed, enhanced exposure techniques may be provided such that pattern structures 113, 114 may be substantially aligned within trenches 103 of grating pattern 102. Such alignment may be due, at least in part, to the harvesting, localization, or utilization of secondary electrons within trenches 103. For example, secondary electrons may be held within trenches 103 to help align pattern structures 113, 114 within trenches 103. Furthermore, other effects may provide or cause such self-alignment. For example, surface tension between the materials of line features 104 and resist 106 may cause pattern structures 113, 114 to substantially align within trenches 103. Such mechanisms and the results thereof are discussed further with respect to FIGS. 2A and 2B. Furthermore, as discussed, lower dosages of radiation 108 may be used to expose exposed portions 109, 110 to retain pattern structures 113, 114 when compared with exposure on a flat surface (e.g., on device layer 101 without grating pattern 102). Such reduction may be due to the localization of secondary electrons as discussed herein. Such enhanced exposure techniques may provide aligned and/or anchored pattern structures 113, 114 that provide a high fidelity final pattern for subsequent processing. Furthermore, such enhanced exposure techniques may be contrasted with earlier under-exposure techniques that may anchor pattern structures using scumming or the like which may cause undesired patterning and/or defectivity.

Figure 2A:
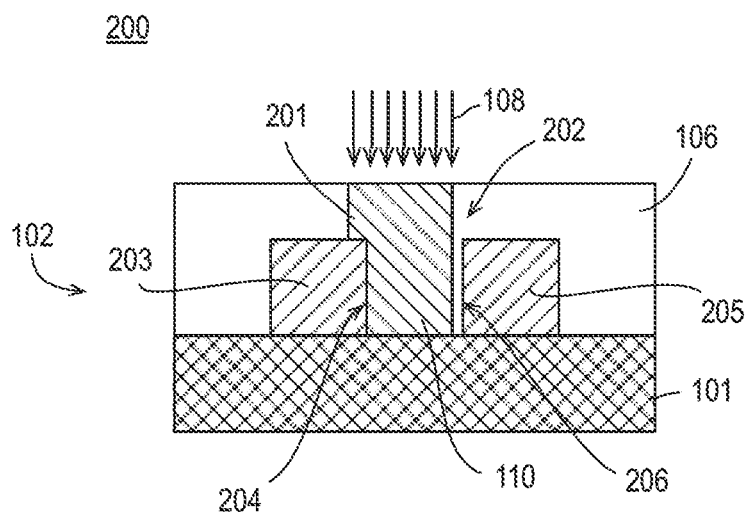
FIGS. 2A and 2B are side views of example device structures as particular fabrication operations are performed.
Figure 2B:
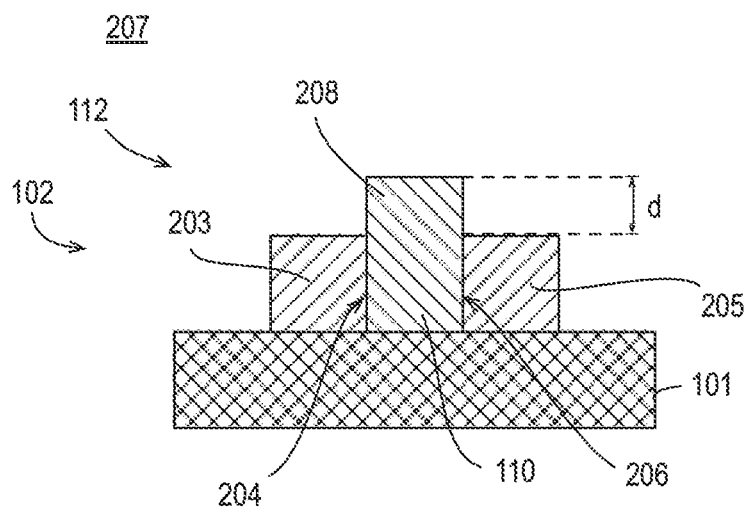

FIGS. 2A and 2B are side views of example device structures as particular fabrication operations are performed, arranged in accordance with at least some implementations of the present disclosure. As shown in FIG. 2A, a device structure 200 may include grating pattern 102 disposed on device layer 101 and resist layer 106 disposed over grating pattern 102. Furthermore, resist layer 106 may be exposed by radiation 108 to form exposed portion 110 within a trench (not labeled) of grating pattern 102. For example, device structure 200 may be similar to device structure 107 with a misalignment of radiation 108 within the trench of pattern structure 102. Device layer 101, grating pattern 102, resist layer 106, radiation 108, and exposed portion 110 may include any features as discussed herein and those features will not be repeated for the sake of clarity of presentation.

As shown in FIG. 2A, exposed portion 110 may include or have adjacent thereto an exposed portion 201. As shown, exposed portion 201 may be adjacent to the trench of grating pattern 102 and exposed portion 201 may be over a line feature 203 of grating pattern 201. Exposed portion 201 may overlap a sidewall 204 of line feature 203 for example. Furthermore, a portion 202 of resist 106 within the trench of grating pattern 102 may be adjacent to exposed portion 110 and adjacent to sidewall 206 of line feature 205. As shown, portion 202 of resist 106 may be unexposed or not fully exposed during the exposure of resist 106 by radiation 108. As used herein, exposed or exposed resist may indicate a resist layer has been exposed to radiation (e.g., via a lithography exposure system) and unexposed or not fully exposed may indicate a resist layer has not been exposed to radiation. For example, in the context of negative resist, exposing a region of resist 106 where a pattern feature is not intended may typically be undesirable and not fully exposing or not exposing a region or portion where a pattern feature is intended may also typically be undesirable as such misplaced exposures may be expected to cause misplaced pattern structures after developing the resist layer.

FIG. 2B illustrates a device structure 207 similar to device structure 200, after the develop of resist layer 106. As shown in FIG. 2B, a pattern structure 208 of pattern layer 112 may substantially or fully aligned within the trench of grating pattern 112 despite exposed portion 201 being misaligned and portion 202 not receiving radiation exposure due to misalignment. As shown, pattern structure 208 may be fully or substantially self-aligned to sidewall 106 of line feature 205 and sidewall 204 of line feature 203. For example, using the techniques discussed herein, pattern structure 208 may snap to the trench of grating pattern 102. Such self-alignment may be due to secondary electrons being contained or harvested within the trench between line features 203, 205, due to fluid dynamic based interactions between resist 106 and line features 203, 205, the reduced dosage needed to exposed portion 110, or the like. Such a processing feature may provide wider processing windows or tolerances and/or the ability to form sub-resolution features with pattern fidelity.

In the example of FIGS. 2A and 2B, the exposure of radiation 108 is shown misaligned with the trench of pattern layer 112 such that exposed portion 201 occurs over line feature 203 and under or unexposed portion 202 occurs adjacent to line feature 205. In other examples, exposure may cause exposed portions over both line features or under or unexposed portions 202 over both line features. In such examples, pattern structure 208 may similarly snap to the trench of grating pattern into substantial self alignment. In some examples, particularly those where exposed portions occur of both line features, the self alignment of pattern structure 208 may include a portion over one or both of the line features. Furthermore, although illustrated with pattern structure 208 aligning along both of its edges within the trench of pattern layer 102, in some examples, pattern structure 208 may align only one edge along a line feature (e.g., aligned with sidewall 204 of line feature 203) and the remainder of pattern structure 208 may extend over and across another line feature (e.g., line feature 205) based on the desired final pattern structure. Furthermore, as discussed above, in some examples, a top of pattern structure 208 may be at a height or distance, d, above a top of line features 203, 205. In other examples, the top of pattern structure 208 may be substantially planar with the top of line features 203, 205.

As discussed, grating pattern 102 may be formed using any suitable technique or technique such as patterning resist using 193 nm lithography techniques (e.g., either with or without immersion), transferring a pattern (e.g., formed using lithography) to a hardmask layer or material stack, or the like. In some examples, grating pattern 102 may be formed using a self-aligned spacer technique as discussed with respect to FIGS. 3A, 3B, 3C, and 3D.

Figure 3A:
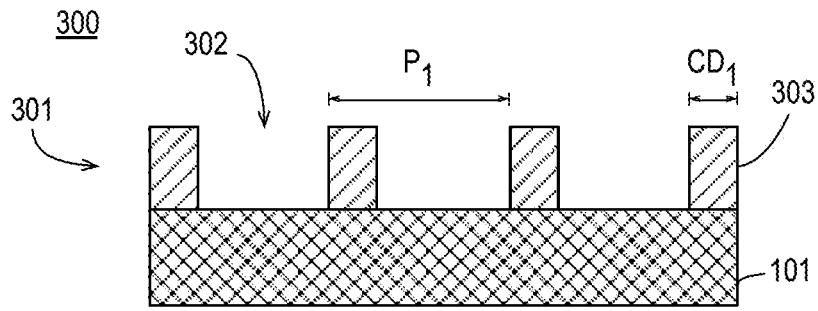
FIGS. 3A, 3B, 3C, and 3D are side views of example device structures as particular fabrication operations are performed.

FIGS. 3A, 3B, 3C, and 3D are side views of example device structures as particular fabrication operations are performed, arranged in accordance with at least some implementations of the present disclosure. For example, the fabrication operations discussed with respect to FIGS. 3A, 3B, 3C, and 3D may be used to dispose a grating pattern on a device layer (e.g., grating pattern 102 on device layer 101 as discussed herein). As shown in FIG. 3A, a device structure 300 may include a device layer 101 and a grating pattern 301 including trenches 302 interspersed among line features 303. Device layer 101 may include any features as discussed herein and such features will not be repeated for the sake of brevity. Grating pattern 301 may be formed using any suitable technique such as lithography techniques as discussed herein (e.g., such that grating pattern 301 includes a resist material), using a lithography and etch to transfer a pattern to a layer disposed on device layer 101 to form grating pattern 301, or the like. In an example, device layer 101 includes a stack of materials including a crystalline silicon layer, a pad or buffer oxide on the crystalline layer (e.g., a 15 to 20 nm pad oxide layer), and a nitride layer on the pad or buffer oxide (e.g., a 40 to 60 nm nitride layer disposed via chemical vapor deposition) and grating pattern 301 includes polysilicon line features 303 disposed on the nitride layer. In other examples, line features may include any material or materials as discussed with respect to line features 104.

As shown, line features 303 may include a critical dimension, $CD_1$, and a pitch, $P_1$. The critical dimension may be a smallest available feature size that may be repeatedly patterned using a lithography process such as 193 nm immersion lithography for example. The pitch may be determined similarly based on a smallest available pitch and/or based on a desired critical dimension and/or pitch after processing as discussed herein (e.g., based on a desired critical dimension, $CD_2$, and pitch, $P_2$, as shown with respect to FIG. 3D). The critical dimension may include any critical dimension such as a critical dimension of 21 nm, a critical dimension in the range of 21 to 26 nm, a critical dimension in the range of about 25 to 32 nm, or the like. Similarly, the pitch may be any suitable pitch such as a pitch of 84 nm, a pitch in the range of 80 to 90 nm, a pitch in the range of 88 to 95 nm, or the like.

Figure 3B:
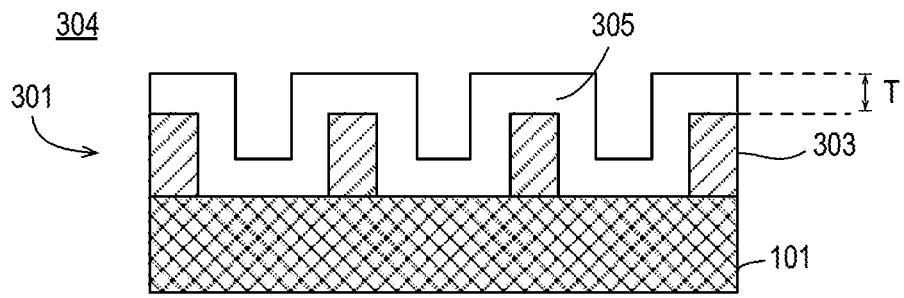

FIG. 3B illustrates a device structure 304 similar to device structure 300, after the formation of conformal layer 305. As shown in FIG. 3B, conformal layer 305 may be disposed over grating pattern 301. Conformal layer 305 may be any suitable material or materials such as an oxide or the like. Furthermore, conformal layer 305 may be formed using any suitable technique or techniques such as a chemical vapor deposition or the like. As shown in FIG. 3B, conformal layer 305 may have a thickness, T. The thickness of conformal layer 305 may be any suitable thickness associated with a desired critical dimension (e.g., critical dimension, $CD_2$) of subsequently formed sidewall spacers/line features as is discussed further herein. For example, the thickness, T, may be a thickness of 34 nm, a thickness in the range of 30 to 35 nm, a thickness in the range of about 33 to 45 nm, or the like.

Figure 3C:
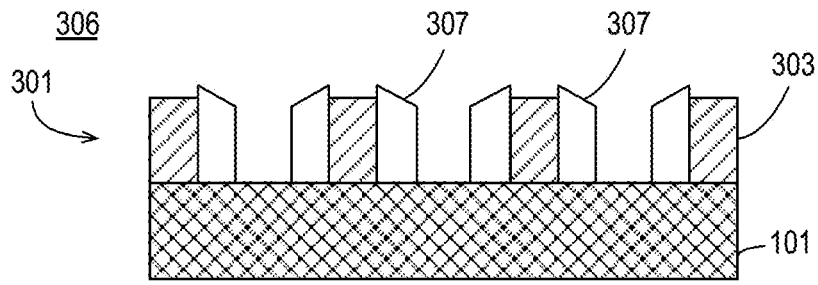

FIG. 3C illustrates a device structure 306 similar to device structure 304, after the formation of sidewall spacers 307 from conformal layer 305. Sidewall spacers 307 may be formed using any suitable technique or techniques. In some examples, sidewall spacers 307 may be formed by performing an anisotropic etch of conformal layer 305. For example, the anisotropic etch may be a timed etch and/or an etch having an etch selectivity between the material of conformal layer and the materials of line features 303 and the portion of device layer 101 adjacent to conformal layer 305. In examples where conformal layer 305 is an oxide, the anisotropic etch may include an oxide etch process.

Figure 3D:
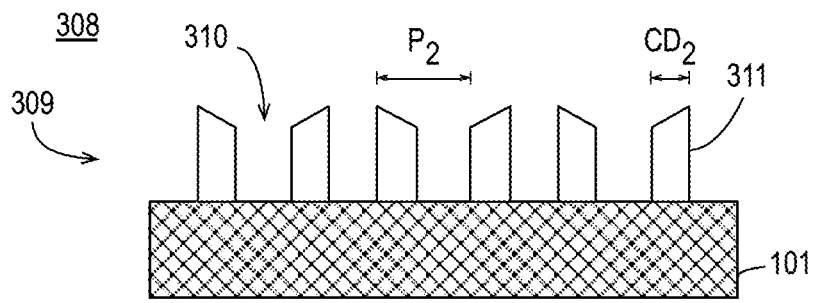

FIG. 3D illustrates a device structure 308 similar to device structure 306, after the removal of line features 303. Line features 303 may be removed using any suitable technique or techniques such as etch techniques. In examples where line features 303 are polysilicon, a polysilicon etch may be performed. In some examples, the etch may be selective between the material of line features 303 and the material or materials of sidewall spacers 307 and the portion of device layer 101 adjacent to line features 303. As shown, the removal of line features 303 may leave a grating pattern 309 having trenches 310 interspersed among line features 311. For example, grating pattern 309 may be implemented as grating pattern 102 as discussed herein. Furthermore, grating pattern 309 may include line features having a critical dimension, $CD_2$, provided at a pitch, $P_2$. In some examples, critical dimension $CD_2$ may be smaller than critical dimension $CD_1$. In other examples, critical dimension $CD_2$ may be the same as critical dimension $CD_1$. In yet other examples, critical dimension $CD_2$ may be larger than critical dimension $CD_1$. For example, critical dimension $CD_2$ may be may include any critical dimension such as a critical dimension of 21 nm, a critical dimension in the range of 21 to 26 nm, a critical dimension in the range of about 25 to 32 nm, or the like.

Furthermore, as shown, the pitch $P_2$ of grating pattern 309 may be substantially less than the pitch $P_1$ of grating pattern 301. In examples where critical dimension CD1 is the same as critical dimension $CD_2$, the pitch $P_2$ of grating pattern 309 will be half of the pitch $P_1$ of grating pattern 301, for example, although other critical dimension relationships and resulting pitches are available. As shown, the process discussed with respect to FIGS. 3A-3D may provide a substantially reduced pitch, which may subsequently provide for sub-resolution features with pattern fidelity generated based on the non-reflecting radiation lithography on grating techniques discussed herein with respect to FIGS. 1A-1D and elsewhere herein. The process discussed with respect to FIGS. 3A-3D may provide a uniform pitch-halved grating formed using 193 nm lithography. The described techniques may be repeated to form pitch-quartered gratings or they may be modified to form pitch-third or pitch-sixth gratings or the like. Furthermore, such techniques may be performed on grating patterns having rows of trenches interspersed among rows of line features (e.g., 1-dimensional linear grating patterns), grating patterns having trenches interspersed among intersecting regions of the plurality of line features (e.g., 2-dimensional grid grating patterns), or grating patterns having other patterns.

Figure 4:
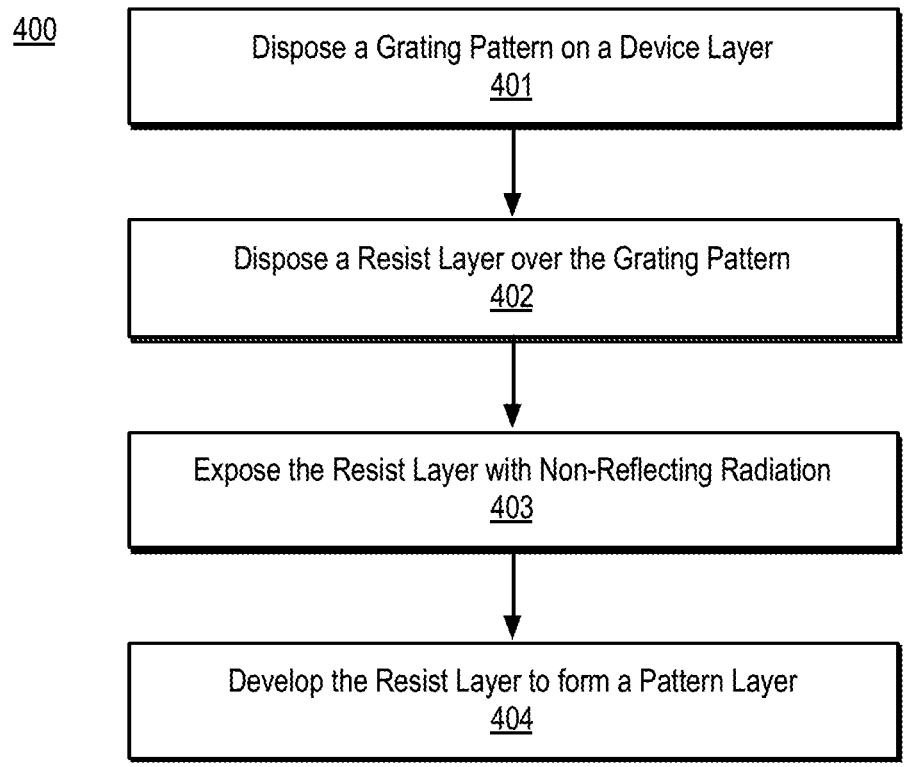
FIG. 4 is a flow diagram illustrating an example process for forming a device structure using a multi-pass patterning technique.

FIG. 4 is a flow diagram illustrating an example process for forming a device structure using a multi-pass patterning technique, arranged in accordance with at least some implementations of the present disclosure. For example, method 400 may be implemented to fabricate device structure 111 or device structure 207 as discussed or method 400 may be implemented to fabricate device structures 603, 703, 804, or 903 as discussed further herein. In the illustrated implementation, process 400 may include one or more operations as illustrated by operations 401-404. However, embodiments herein may include additional operations, certain operations being omitted, or operations being performed out of the order provided.

Method 400 may begin at operation 401, "Dispose a Grating Pattern on a Device Layer", where a grating pattern may be disposed on a device layer. For example, a grating pattern having a plurality of trenches interspersed among a plurality of line features may be formed on a device layer. In an embodiment, grating pattern 102 may be disposed on device layer 101 as discussed with respect to FIG. 1A. For example, grating pattern 102 may be formed using lithography techniques to generate a resist grating pattern, a pattern may be transferred to a material layer such as a hardmask layer to form a hardmask grating pattern, or self-aligned sidewall spacers may be used to form a grating pattern as discussed with respect to FIGS. 3A-3D. For example, the grating pattern (e.g., the underlying gratings or grating patterns) may be made of oxides, nitrides, carbides, silicides, hardmasks, dielectrics, metallic oxides, metallic nitrides, interlayer dielectrics (ILDs), organic materials, or inorganic materials depending on the patterning process and/or the device structure process being implemented. For example, the grating pattern may be part of a final grating pattern (e.g., in dielectric/ILD) or they may be part of the hardmask pattern that may be transferred into a dielectric. As discussed, the grating pattern may be made using 193 nm lithography (e.g., 193 nm immersion lithography). Such grating pattern may be smooth and uniform pitch halved/quartered/sixth. Furthermore, such grating patterns may be multi-colored as discussed herein.

Method 400 may continue at operation 402, "Dispose a Resist Layer over the Grating Pattern", where a resist layer may be formed over the grating pattern. In an embodiment, resist layer 106 may be disposed over grating pattern 102 as discussed with respect to FIG. 1B. In some examples, the top of the resist layer may be a distance above the top of the line features of grating pattern 102. In other examples, the top of the resist layer may be substantially planar with top surfaces of the grating pattern. The resist layer may be disposed over the grating pattern using any suitable technique such as a spin-on technique.

Method 400 may continue at operation 403, "Expose the Resist Layer with Non-Reflecting Radiation", where the resist layer may be exposed with non-reflecting radiation. For example, the non-reflecting radiation may be electromagnetic radiation having a wavelength of not more than 120 nm such as EUV radiation or the non-reflecting radiation may be electron-beam radiation (e.g., e-beam radiation). In an embodiment, resist layer 106 may be exposed with radiation 108 (e.g., non-reflecting radiation) to generate enhanced exposure portion 109 within a trench of grating pattern 102 as discussed with respect to FIG. 1C.

Method 400 may continue at operation 404, "Develop the Resist Layer to form a Pattern Layer", where the resist layer may be developed to form a pattern layer. As discussed herein, the resist layer may be either a positive or negative photoresist such that exposed portions may be removed or retained, respectively, during such developing operation. In an embodiment, resist layer 106 may be developed to form pattern layer 112 having pattern structure 113 on device layer 101 and within a trench of grating pattern 112. In some examples, the pattern structure may snap to or self align within a trench of the grating pattern as discussed herein.

As discussed, method 400 may be implemented to fabricate device structures as described herein. Any one or more of the operations of method 400 (or the operations discussed herein with respect to FIGS. 1A-1D, FIGS. 2A-2B, or FIGS. 3A-3D) may be undertaken in response to instructions provided by one or more computer program products. Such program products may include signal bearing media providing instructions that, when executed by, for example, a processor, may provide the functionality described herein. The computer program products may be provided in any form of computer readable medium. Thus, for example, a processor including one or more processor core(s) may undertake one or more of the described operations in response to instructions conveyed to the processor by a computer readable medium.

Furthermore, any one or more of the operations of method 400 (or the operations discussed herein with respect to FIGS. 1A-1D, FIGS. 2A-2B, or FIGS. 3A-3D) may be undertaken to form a device such as a transistor or the like. For example, multi-pass patterning using non-reflecting radiation lithography on an underlying grating may be used to generate devices such as transistor devices, memory devices, or the like using such patterns to transfer patterns to underlying layers (e.g., via etch processing), to selectively provide materials to an underlying surface (e.g., via implantation and/or deposition, plating, or the like and subsequent pattern removal), and so on. For example, systems, apparatuses or devices may be formed that include a device layer such as a semiconductor substrate and one or more integrated circuit structures coupled to (e.g., on and/or within the semiconductor substrate) the semiconductor substrate such that the one or more integrated circuit structures are fabricated using techniques discussed herein.

For example, apparatuses or devices may be formed that include a device layer such as a semiconductor substrate and one or more integrated circuit structures coupled to the semiconductor substrate such that the one or more integrated circuit structures are fabricated by disposing a grating pattern having a plurality of trenches interspersed among a plurality of line features on a device layer, disposing a resist layer over the grating pattern, exposing the resist layer with non-reflecting radiation to generate an enhanced or accelerated exposure portion of the resist layer within at least one trench of the grating pattern, and developing the resist layer to form a pattern layer having at least a pattern structure on the device layer and within the least one trench of the grating pattern. Such integrated circuit structures may be further fabricated using any techniques discussed herein. For example, such integrated circuit structures may be integrated into platforms and/or computing devices as discussed herein with respect to FIGS. 10 and 11.

The techniques discussed herein may be used to form a wide variety of final patterns (e.g., pattern layers formed over grating patterns). As discussed, FIG. 5 is plan view 500 of example grating pattern 102 including trenches 103 interspersed among line features 104 on device layer 101 (in FIG. 5 and the subsequent FIGS., device layer 101 is illustrated without cross-hatching for the sake of clarity of presentation).

In FIGS. 6A-6C, 7A-7C, 8A-8C, and 9A-9C each grouping (e.g., 6A-6C and the like) provides an example plan view of a pattern layer for overlaying with grating pattern 102 to form a final overlaid pattern, the resultant final overlaid pattern, and a cross-section of the final overlaid pattern. FIGS. 6A, 7A, 8A, and 9A are plan views of example pattern layers on a flat substrate layer, arranged in accordance with at least some implementations of the present disclosure. For example, such pattern layers may be for illustrative purposes only and, for example, such pattern layers may, in some cases, be unattainable (e.g., sub-resolution) patterns on such flat substrate layers. However, using the techniques discussed herein, such example pattern layers may be formed over grating pattern 102 to provide final overlaid patterns, which may include sub-resolution features. FIGS. 6B, 7B, 8B, and 9B are plan views of example final overlaid patterns, arranged in accordance with at least some implementations of the present disclosure. The illustrated final overlaid patterns may be transferred to an underlying layer of device layer 101 or they may be used to selectively deposit material on device layer 101. Furthermore, cross sections of such final overlaid patterns are provided for the sake of clarity of presentation. FIGS. 6C, 7C, 8C, and 9C are cross-sections, taken along lines A-A', of example final overlaid patterns, arranged in accordance with at least some implementations of the present disclosure.

Figure 6A:
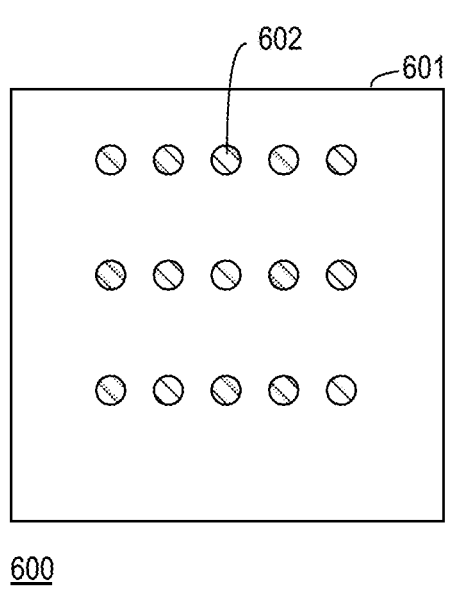
FIG. 6A is a plan view of an example pattern layers on a flat substrate layer.

For example, FIG. 6A illustrates a plan view of an example pattern 600 on an example substrate layer 601. Substrate layer 601 may include any flat substrate layer material. As discussed, pattern 600 may be for illustrative purposes to show a pattern that may be combined with grating layer 102 to form a device structure 603. For example, pattern 600 includes an array of islands 602 on substrate layer 601. For example, as used herein, the term pattern layer may correspond to a patterned resist layer overlaying or combined with an underlying grating pattern and a pattern may correspond to a pattern that may be combined with the grating pattern to form a final pattern including the grating pattern overlaid by the pattern layer. FIG. 6B illustrates example device structure 603 having a pattern layer including a grid of aligned blocks 604 within trenches 605 such that vias 606 are formed between aligned blocks 604 within trenches 605. Device structure 603 may be formed using any techniques discussed herein such as those discussed with respect to FIGS. 1A-1D.

For example, pattern 600 may be overlaid onto or combined with grating pattern 102 to form device structure 603. As shown, device structure 603 may include trenches 103 interspersed among line features 104 overlaid or combined with aligned blocks 604 (e.g., with aligned blocks 604 within trenches 605). Furthermore, device structure 603 may include a pattern layer including aligned blocks 604 overlaid or combined with grating pattern 102. For example, aligned blocks 604 may correspond to islands 602 in pattern 600. In the example of FIG. 6B, aligned blocks 604 have concave edges. In other examples, aligned blocks 604 may have substantially straight edges. Furthermore, in the illustrated example, aligned blocks 604 are shown within trenches 605 while other trenches 103 expose portions of device layer 101. In other examples, aligned blocks 604 and corresponding vias 606 may be formed in all trenches 605. In yet other examples, aligned blocks 604 and corresponding vias 606 may be formed in some trenches (e.g., trenches 605) while other trenches may be filled (e.g., with resist). Furthermore, vias 606 are illustrated in a grid pattern. In other examples, vias 606 may be formed in a pattern suitable to the formation of a device structure (e.g., vias 606 may be formed where needed to make contact to an underlying device or the like).

Figure 6C:
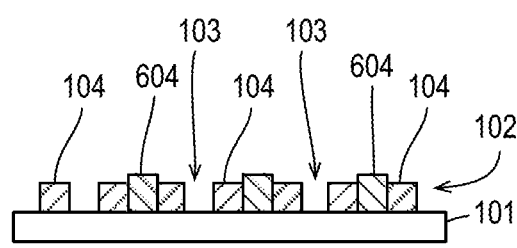
FIG. 6C is a cross-section of the example final overlaid pattern of FIG. 6B.

FIG. 6C provides a cross section of device structure 603 taken along lines A-A'. As shown in FIG. 6C, aligned blocks 604 may be formed such that they are self-aligned or substantially self-aligned within trenches of grating pattern 102. Furthermore, FIG. 6C illustrates aligned blocks 604 may extend above line features 104 as discussed herein. In other examples, aligned blocks 604 may be planar with line features 104. As discussed herein, in some examples, the pattern of device structure 603 may be used as a grating pattern or pre-pattern or the like for multi-pass patterning. For example, the pattern of device structure 603 may be used as a starting point for the techniques discussed with respect to operations 402-404 and elsewhere herein to form a subsequent device structure.

Figure 7A:
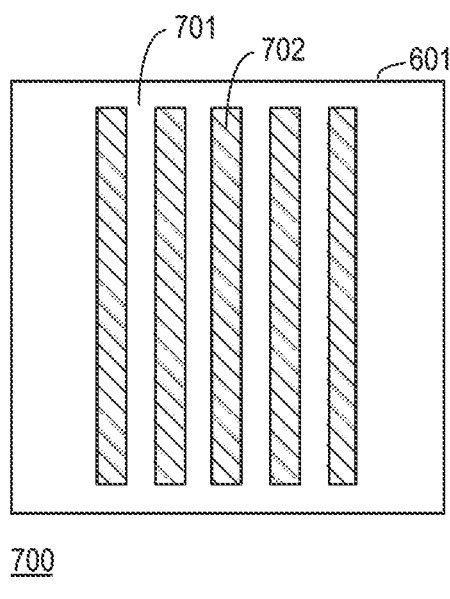
FIG. 7A is a plan view of an example pattern layers on a flat substrate layer.
Figure 7B:
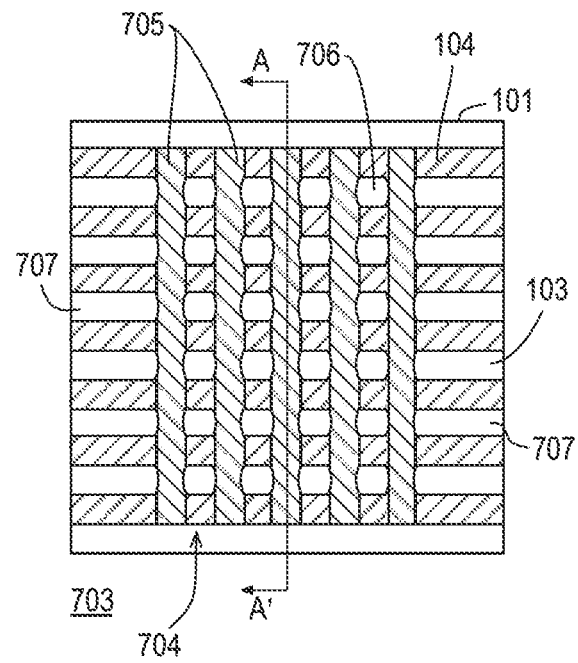
FIG. 7B is a plan view of an example final overlaid pattern.

FIG. 7A illustrates a plan view of an example pattern 700 on an example substrate layer 601. As discussed, pattern 700 may be for illustrative purposes to show a pattern that may be combined with grating layer 102 to form a device structure 703. For example, pattern 700 includes an array of trenches 701 interspersed among an array of lines 702 on substrate layer 601. FIG. 7B illustrates example device structure 703 having a pattern layer including trenches 704 interspersed among line features 705 such that line features 705 are orthogonal or substantially orthogonal to line features 104 and such that vias 706 are formed at intersections of trenches 704 and trenches 103. For example, device structure 703 may be formed using any techniques discussed herein such as those discussed with respect to FIGS. 1A-1D.

For example, pattern 700 may be overlaid onto or combined with grating pattern 102 to form device structure 703. As shown, device structure 703 may include trenches 704 interspersed among line features 705 overlaid or combined with line features 104 (e.g., with portions of line features 705 within portions of trenches 103). Furthermore, device structure 703 may include a pattern layer including line features 705 overlaid or combined with grating pattern 102. For example, line features 705 may correspond to lines 702 in pattern 700. In the example of FIG. 7B, line features 705 have concave edges within trenches 103. In other examples, line features 705 may have substantially straight edges within trenches 103. Furthermore, device structure 703 illustrates portions outside of the grid pattern of vias 706 and within trenches 103 as exposed (e.g., portions 707 of device layer 101 are exposed). In other examples, such portions may be filled with pattern structures such as resist structures. In device structure 703, vias 706 are illustrated in a grid pattern. In other examples, vias 706 may be formed in a pattern suitable to the formation of a device structure (e.g., vias 706 may be formed where needed to make contact to an underlying device or the like).

Figure 7C:
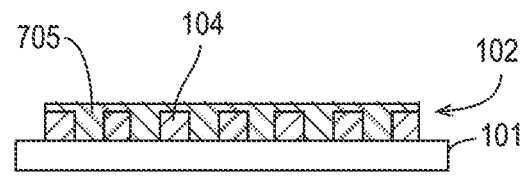
FIG. 7C is a cross-section of the example final overlaid pattern of FIG. 7B.

FIG. 7C provides a cross section of device structure 703 taken along lines A-A'. As shown in FIG. 7C, line features 705 may be formed such that they are on device layer 101 and within trenches of grating pattern 102. Furthermore, FIG. 7C illustrates line features 705 may extend above line features 104 as discussed herein. In other examples, line features 705 may be planar with line features 104. As discussed herein, in some examples, the pattern of device structure 703 may be used as a grating pattern or pre-pattern or the like for multi-pass patterning. For example, the pattern of device structure 703 may be used as a starting point for the techniques discussed with respect to operations 402-404 and elsewhere herein to form a subsequent device structure.

Figure 8A:
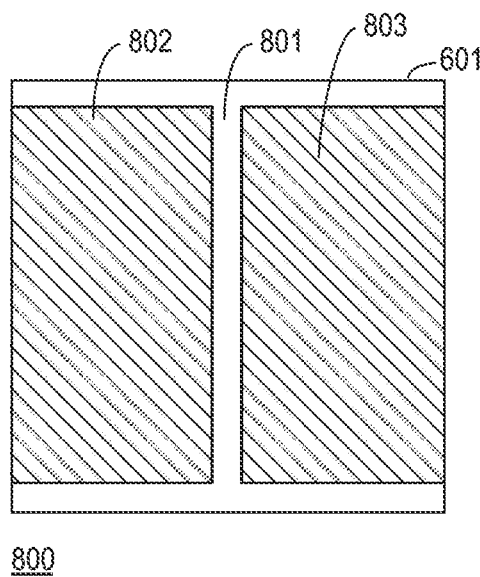
FIG. 8A is a plan view of an example pattern layers on a flat substrate layer.
Figure 8B:
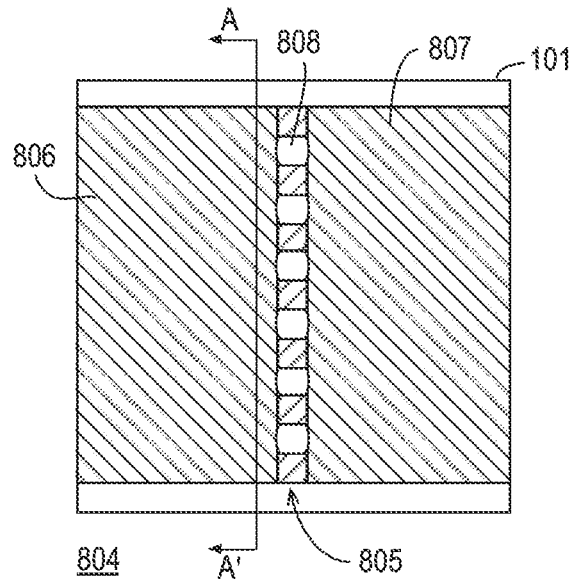
FIG. 8B is a plan view of an example final overlaid pattern.

FIG. 8A illustrates a plan view of an example pattern 800 on an example substrate layer 601. As discussed, pattern 800 may be for illustrative purposes to show a pattern that may be combined with grating layer 102 to form a device structure 804. For example, pattern 800 includes an isolated trench 801 between two mesas 802, 803 on substrate layer 601. FIG. 8B illustrates example device structure 804 having a pattern layer including isolated trench 805 between two mesas 806, 807 such that isolated trench 805 is orthogonal or substantially orthogonal to line features 104 (not labeled in FIG. 8B, please refer to FIG. 5) such that a line of vias x are formed at the intersections of trenches 103 (not labeled in FIG. 8B, please refer to FIG. 5) and isolated trench 805. For example, device structure 804 may be formed using any techniques discussed herein such as those discussed with respect to FIGS. 1A-1D.

For example, pattern 800 may be overlaid onto or combined with grating pattern 102 to form device structure 804. As shown, device structure 804 may include mesas 806, 807 overlaid or combined with line features 104 and trenches 103. Furthermore, device structure 804 may include a pattern layer including mesas 806, 807 having isolated trench

805 therebetween overlaid or combined with grating pattern 102. For example, mesas 806, 807 may correspond to mesas 802, 803 in pattern 800. In the example of FIG. 8B, mesas 806, 807 have concave edges within trenches 103. In other examples, mesas 806, 807 may have substantially straight edges within trenches 103. In device structure 804, vias 808 are illustrated in a line pattern. In other examples, vias 808 may be formed in a pattern suitable to the formation of a device structure (e.g., vias 706 may be formed where needed to make contact to an underlying device or the like). For example, vias 808 may be formed in only some of trenches 103 instead of each of trenches 103 as shown in FIG. 8B.

Figure 8C:
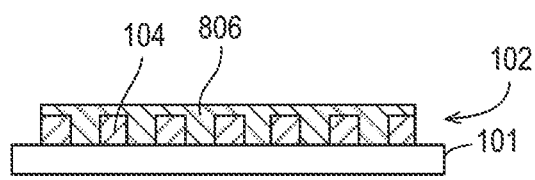
FIG. 8C is a cross-section of the example final overlaid pattern of FIG. 8B.

FIG. 8C provides a cross section of device structure 804 taken along lines A-A'. As shown in FIG. 8C, mesas 806, 807 (e.g., as shown with respect to mesa 806) may be formed such that they are on device layer 101 and within trenches of grating pattern 102. Furthermore, FIG. 8C illustrates mesas 806, 807 may extend above line features 104 as discussed herein. In other examples, line mesas 806, 807 may be planar with line features 104. As discussed herein, in some examples, the pattern of device structure 603 may be used as a grating pattern or pre-pattern or the like for multi-pass patterning. For example, the pattern of device structure 804 may be used as a starting point for the techniques discussed with respect to operations 402-404 and elsewhere herein to form a subsequent device structure.

FIG. 9A illustrates a plan view of an example pattern 900 on an example substrate layer 601. As discussed, pattern 900 may be for illustrative purposes to show a pattern that may be combined with grating layer 102 to form a device structure 903. For example, pattern 900 includes a grid of staggered islands 902 on substrate layer 601. As illustrated in FIG. 9A, in some examples, pattern 900 may include a grid of staggered islands 902 such that islands 902 may be substantially circular. In other examples, pattern 900 may include a grid of staggered short lines such that islands 902 may be elongate in either the x-direction or the y-direction (please refer to FIG. 5 for x- and y-orientations). FIG. 9B illustrates example device structure 903 having a pattern layer including a grid of staggered blocks 904 within trenches 906, 908 such that a line of vias 905 (e.g., a line of vias 905 within trench 906) is offset with respect to a second line of vias 907 (e.g., a line of vias 907 within trench 908). For example, there is an offset between the line of vias 905 within trench 906 and the line of vias 907 within trench 908. Device structure 903 may be formed using any techniques discussed herein such as those discussed with respect to FIGS. 1A-1D.

For example, pattern 900 may be overlaid onto or combined with grating pattern 102 to form device structure 903. In FIG. 9B, vias 905, 907 are illustrated in a staggered grid pattern. In other examples, vias 905, 907 may be formed in a pattern suitable to the formation of a device structure (e.g., vias 905, 907 may be formed where needed to make contact to an underlying device or the like) such that at least a portion of the desired pattern includes a staggered grid pattern.

FIG. 9C provides a cross section of device structure 903 taken along lines A-A'. As shown in FIG. 9C, blocks 904 may be formed such that they are self-aligned or substantially self-aligned within trenches of grating pattern 102. Furthermore, FIG. 9C illustrates blocks 904 may be planar with line features 104 as discussed herein. In other examples, blocks 904 may extend above line features 104. As discussed herein, in some examples, the pattern of device structure 603 may be used as a grating pattern or pre-pattern or the like for multi-pass patterning. For example, the pattern of device structure 903 may be used as a starting point for the techniques discussed with respect to operations 402-404 and elsewhere herein to form a subsequent device structure.

As discussed with respect to FIGS. 6A-6C, 7A-7C, 8A-8C, and 9A-9C, a device or transistor structure as discussed herein may include a grating pattern (e.g., grating pattern 102) having trenches (e.g., trenches 103) interspersed among line features (e.g., line features 104) on a device layer (e.g., device layer 101). The device or transistor structure may include a pattern layer (e.g., a pattern layer of device structure 603, 703, 804, or 903 as described, or the like) disposed over the grating pattern and the device layer. The pattern layer may include pattern structures (e.g., blocks 604, 904, line features 705, or mesas 806, 807, or the like) having a gap or gaps therebetween (e.g., gaps—not labeled, please refer to FIGS. 6A and 9A—between blocks 604 and blocks 904, 905, trenches 704 between line features 705, or isolated trench 805 between mesas 806, 807, or the like). In some embodiments, the device or transistor structure may include vias, contacts, or holes (e.g., vias 606, 706, 808, 905, 907, or the like) at intersections between the gap or gaps and the trenches of the grating pattern. In other embodiments, other 2-dimensional (2D) features may be formed such as blocks, cuts, one or more lines, lines having ends adjacent to one another, orthogonal lines with one line having an end adjacent to other line, or the like. For example, grating pattern 102 and the overlaying pattern layer may be formed orthogonal or perpendicular to one another to reduce the scaling of available features. For example, 193 nm lithography may provide grating pattern 102 having trenches in one orientation and EUV lithography may be used to define a pattern layer overlaying the grating pattern with features defined in the perpendicular orientation.

Such device or transistor structures may include vias, lines, or other structures having pattern fidelity and sub-resolution feature sizes. As used herein, the term pattern fidelity is used to indicate pattern features that are repeatable and of an intended shape. For example, in the context of vias, pattern fidelity may indicate the vias are substantially circular and that vias may be formed in a consistent manner across a region and at various pitches. Furthermore, as used herein, sub-resolution feature sizes may indicate a feature or features of a pattern may be formed that is smaller than or at a smaller pitch than what may be printed (e.g., via lithography techniques) on a flat surface using 193 nm lithography or EUV lithography techniques. For example, feature sizes may include diameters of vias, widths of lines, widths of trenches, or the like. For example, feature sizes of less than 20 nm may be formed with pattern fidelity using the techniques discussed herein. In other examples, feature sizes may include features at a defined pitch or half-pitch. For example, feature sizes of less than a 40 nm half-pitch may be formed with pattern fidelity using the techniques discussed herein.

Furthermore the device structures discussed herein may be formed with pattern fidelity at sub-resolution feature sizes. For example, vias 808 (please refer to FIG. 8B) may be formed having a diameter of less than 20 nm and/or at less than a 40 nm half-pitch using the techniques discussed herein. For example, vias 808 may be formed as a line of nested vias. In some examples, a grid of vias 606 or an offset grid of vias 905, 907 may be formed having a diameter of less than 20 nm and/or at less than a 40 nm half-pitch using the techniques discussed herein. In other examples, line features may be formed having sub-resolution feature sizes. For example, lines or trenches having a width of less than 10 nm and/or at less than an 20 nm half pitch may be formed using the techniques as discussed herein. Such lines or trenches may have substantially squared corners for example.

As discussed, apparatuses or devices may be formed that include a device layer such as a semiconductor substrate and one or more integrated circuit structures coupled to the semiconductor substrate such that the one or more integrated circuit structures are fabricated by disposing a grating pattern having a plurality of trenches interspersed among a plurality of line features on a device layer, disposing a resist layer over the grating pattern, exposing the resist layer with non-reflecting radiation to generate an enhanced exposure portion of the resist layer within at least one trench of the grating pattern, and developing the resist layer to form a pattern layer having at least a pattern structure on the device layer and within the least one trench of the grating pattern.

Figure 10:
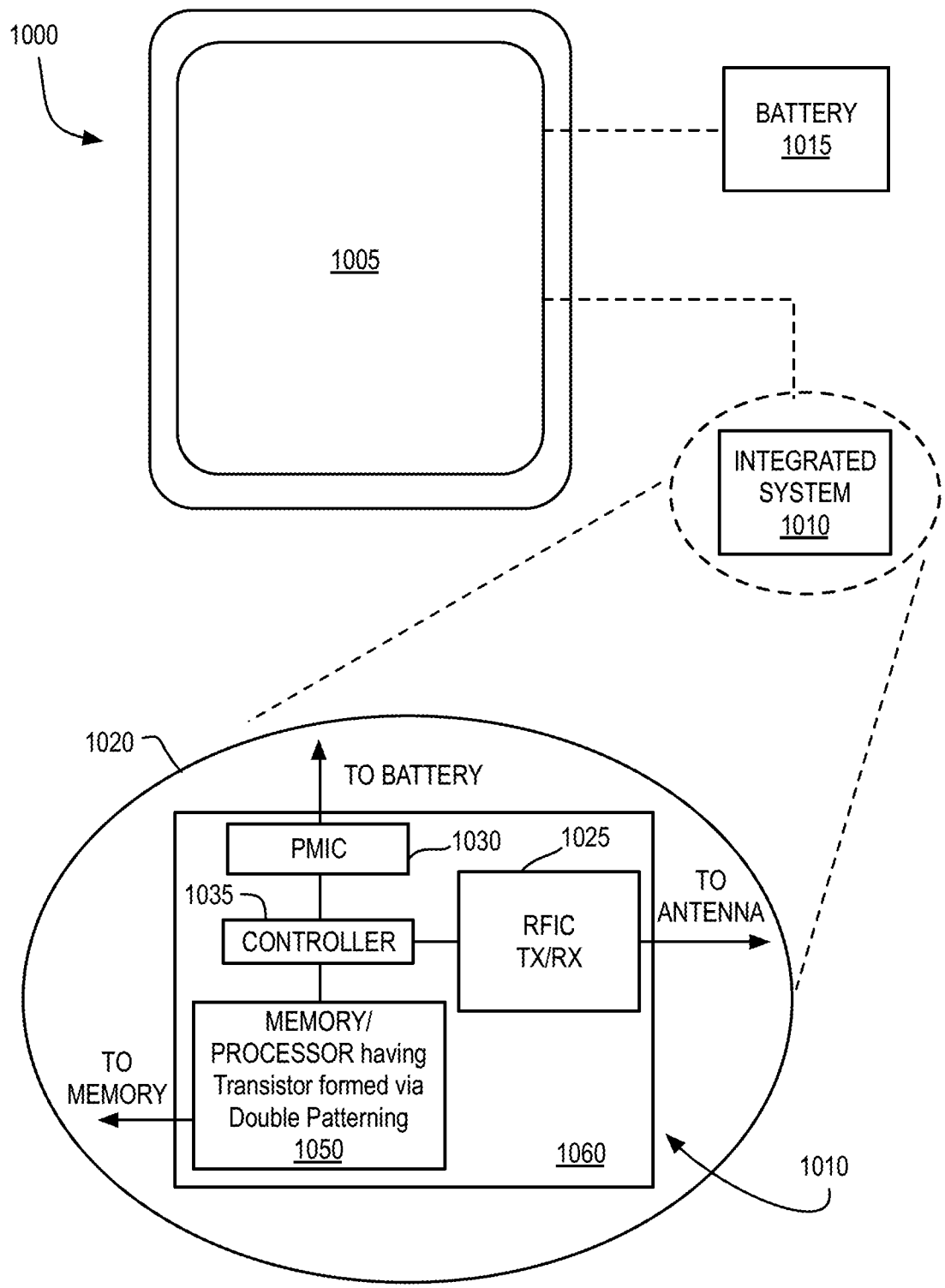
FIG. 10 is an illustrative diagram of a mobile computing platform employing an IC with transistor(s) fabricated via multi-pass patterning using non-reflecting radiation lithography over an underlying grating pattern.

FIG. 10 is an illustrative diagram of a mobile computing platform 1000 employing an IC with transistor(s) fabricated via multi-pass patterning using non-reflecting radiation lithography over an underlying grating pattern, arranged in accordance with at least some implementations of the present disclosure. A transistor fabricated or formed via multi-pass patterning using non-reflecting radiation lithography over an underlying grating pattern may be formed using any technique or techniques as discussed herein. Mobile computing platform 1000 may be any portable device configured for each of electronic data display, electronic data processing, wireless electronic data transmission, or the like. For example, mobile computing platform 1000 may be any of a tablet, a smart phone, a netbook, a laptop computer, etc. and may include a display screen 1005, which in the exemplary embodiment is a touchscreen (e.g., capacitive, inductive, resistive, etc. touchscreen), a chip-level (SoC) or package-level integrated system 1010, and a battery 1015.

Integrated system 1010 is further illustrated in the expanded view 1020. In the exemplary embodiment, packaged device 1050 (labeled "Memory/Processor" in FIG. 10) includes at least one memory chip (e.g., RAM), and/or at least one processor chip (e.g., a microprocessor, a multi-core microprocessor, or graphics processor, or the like). In an embodiment, the package device 1050 is a microprocessor including an SRAM cache memory. In some examples, one or both of the at least one memory and the at least one processor chip includes transistor(s) fabricated or formed via multi-pass patterning using non-reflecting radiation lithography over an underlying grating pattern. For example, one or both of the at least one memory and the at least one processor chip may include a transistor fabricated by disposing a grating pattern having a plurality of trenches interspersed among a plurality of line features on a device layer, disposing a resist layer over the grating pattern, exposing the resist layer with non-reflecting radiation to generate an enhanced exposure portion of the resist layer within at least one trench of the grating pattern, and developing the resist layer to form a pattern layer having at least a pattern structure on the device layer and within the least one trench of the grating pattern.

Packaged device 1050 may be further coupled to (e.g., communicatively coupled to) a board, a substrate, or an interposer 1060 along with, one or more of a power management integrated circuit (PMIC) 1030, RF (wireless) integrated circuit (RFIC) 1025 including a wideband RF (wireless) transmitter and/or receiver (TX/RX) (e.g., including a digital baseband and an analog front end module further comprises a power amplifier on a transmit path and a low noise amplifier on a receive path), and a controller thereof 1035. In general, packaged device 1050 may be also be coupled to (e.g., communicatively coupled to) display screen 1005.

Functionally, PMIC 1030 may perform battery power regulation, DC-to-DC conversion, etc., and so has an input coupled to battery 1015 and with an output providing a current supply to other functional modules. In an embodiment, PMIC 1030 may perform high voltage operations. As further illustrated, in the exemplary embodiment, RFIC 1025 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of packaged device 1050 or within a single IC (SoC) coupled to the package substrate of the packaged device 1050.

Figure 11:
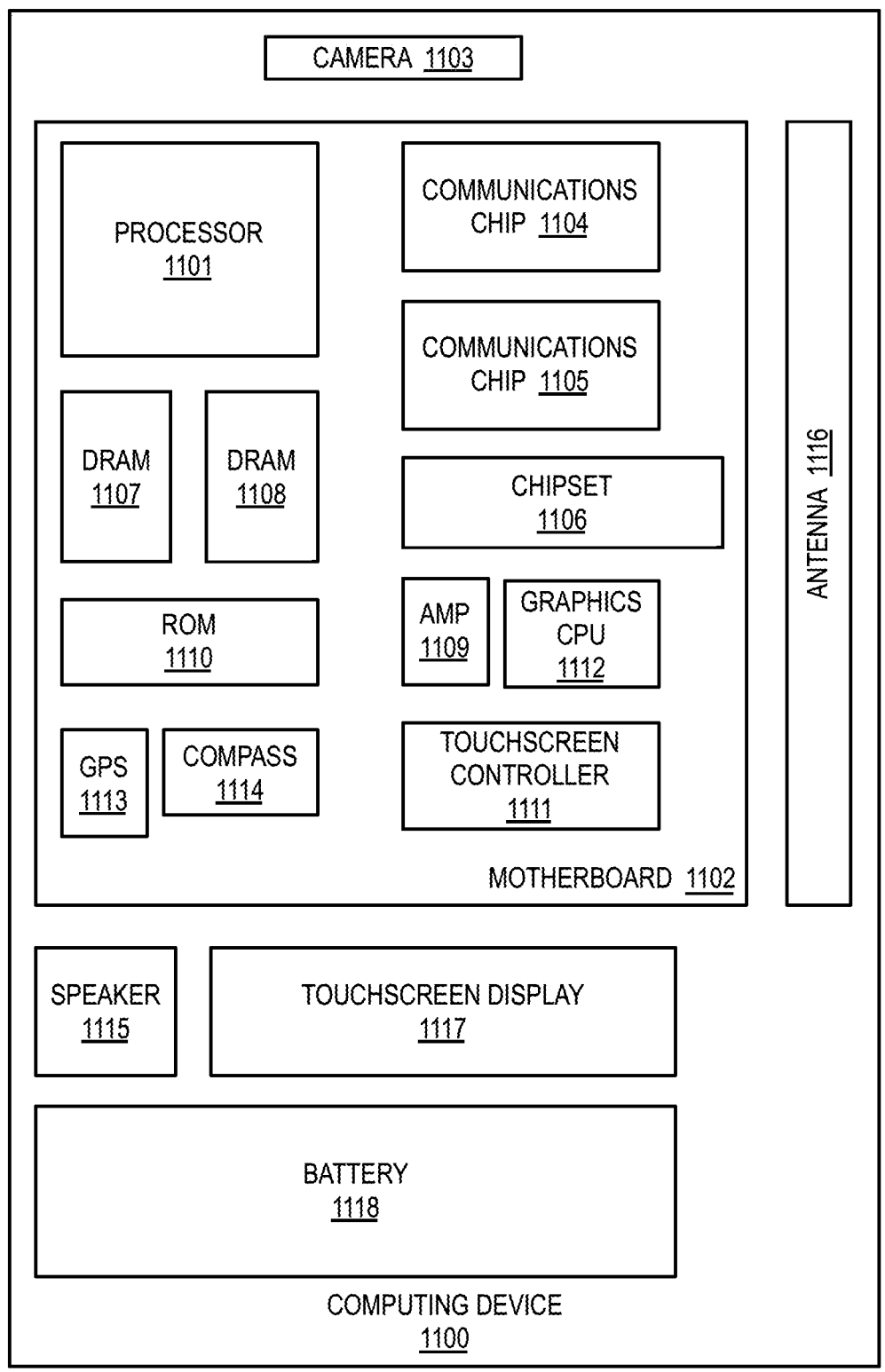
FIG. 11 is a functional block diagram of a computing device, all arranged in accordance with at least some implementations of the present disclosure.

FIG. 11 is a functional block diagram of a computing device 1100, arranged in accordance with at least some implementations of the present disclosure. Computing device 1100 may be found inside platform 1000, for example, and further includes a motherboard 1102 hosting a number of components, such as but not limited to a processor 1101 (e.g., an applications processor) and one or more communications chips 1104, 1105. Processor 1101 may be physically and/or electrically coupled to motherboard 1102. In some examples, processor 1101 includes an integrated circuit die packaged within the processor 1101. In general, the term "processor" may refer to any device or portion of a device that processes electronic data from registers and/or memory to transform that electronic data into other electronic data that may be stored in registers and/or memory.

In various examples, one or more communication chips 1104, 1105 may also be physically and/or electrically coupled to the motherboard 1102. In further implementations, communication chips 1104 may be part of processor 1101. Depending on its applications, computing device 1100 may include other components that may or may not be physically and electrically coupled to motherboard 1102. These other components may include, but are not limited to, volatile memory (e.g., DRAM) 1107, 1108, non-volatile memory (e.g., ROM) 1110, a graphics processor 1112, flash memory, global positioning system (GPS) device 1113, compass 1114, a chipset 1106, an antenna 1116, a power amplifier 1109, a touchscreen controller 1111, a touchscreen display 1117, a speaker 1115, a camera 1103, and a battery 1118, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like.

Communication chips 1104, 1105 may enables wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1104, 1105 may implement any of a number of wireless standards or protocols, including but not limited to those described elsewhere herein. As discussed, computing device 1100 may include a plurality of communication chips 1104, 1105. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

As used in any implementation described herein, the term "module" refers to any combination of software, firmware and/or hardware configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, and/or firmware that stores instructions executed by programmable circuitry. The modules may, collectively or individually, be embodied as circuitry that forms part of a larger system, for example, an integrated circuit (IC), system on-chip (SoC), and so forth.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

The following examples pertain to further embodiments.

In one or more first embodiments, a method comprises disposing a grating pattern having a plurality of trenches interspersed among a plurality of line features on a device layer, disposing a resist layer over the grating pattern, exposing the resist layer with non-reflecting radiation to generate an enhanced exposure portion of the resist layer within at least one trench of the grating pattern, and developing the resist layer to form a pattern layer having at least a pattern structure on the device layer and within the least one trench of the grating pattern.

Further to the first embodiments, exposing the resist layer with non-reflecting radiation comprises exposing the resist layer with at least one of extreme ultraviolet radiation or electron-beam radiation.

Further to the first embodiments, exposing the resist layer with non-reflecting radiation comprises exposing the resist layer with electromagnetic radiation having a wavelength of not more than 120 nm.

Further to the first embodiments, the grating pattern comprises at least one of a second resist, an oxide, a nitride, a carbide, a silicide, a dielectric, a metallic oxide, or a metallic nitride.

Further to the first embodiments, a first line feature of the plurality of line features comprises a first material, and wherein a second line feature of the plurality of line features comprises a second material different than the first material.

Further to the first embodiments, exposing the resist layer comprises exposing a second portion of the resist layer that is adjacent to the at least one trench and over a line feature of the plurality of line features, and wherein the pattern structure is fully aligned with a sidewall of the line feature adjacent to the at least one trench.

Further to the first embodiments, a second portion of the resist layer within the at least one trench and adjacent to a sidewall of a line feature of the plurality of line features is not fully exposed during said exposing the resist layer, and wherein the pattern structure is fully aligned with a sidewall of the line feature adjacent to the at least one trench.

Further to the first embodiments, at least one of exposing the resist layer comprises exposing a second portion of the resist layer that is adjacent to the at least one trench and over a line feature of the plurality of line features or a third portion of the resist layer within the at least one trench and adjacent to a sidewall of the line feature of the plurality of line features is not fully exposed during said exposing the resist layer, and wherein the pattern structure is fully aligned with the sidewall of the line feature adjacent to the at least one trench.

Further to the first embodiments, the grating pattern comprises at least one of rows of the plurality of trenches interspersed among rows of the plurality of line features or the plurality of trenches interspersed among intersecting regions of the plurality of line features.

Further to the first embodiments, disposing the grating pattern on the device layer comprises at least one of forming the grating pattern via 193 nm lithography or transferring a pattern to a hardmask layer to form the grating pattern.

Further to the first embodiments, disposing the grating pattern on the device layer comprises forming a first grating pattern having a plurality of first trenches interspersed among a plurality of first line features on the device layer, disposing a conformal layer over the first grating pattern, performing an anisotropic etch of the conformal layer to form sidewall spacers adjacent to the first line features, and removing the first line features to form the grating pattern having the plurality of line features comprising the sidewall spacers.

Further to the first embodiments, disposing the grating pattern on the device layer comprises at least one of forming the grating pattern via 193 nm lithography or transferring a pattern to a hardmask layer to form the grating pattern or forming a first grating pattern having a plurality of first trenches interspersed among a plurality of first line features on the device layer, disposing a conformal layer over the first grating pattern, performing an anisotropic etch of the conformal layer to form sidewall spacers adjacent to the first line features, and removing the first line features to form the grating pattern having the plurality of line features comprising the sidewall spacers.

Further to the first embodiments, the pattern layer comprises a grid of aligned blocks within at least some of the plurality of trenches, and wherein a plurality of lines of vias are formed between the aligned blocks and within the plurality of trenches.

Further to the first embodiments, the pattern layer comprises an isolated trench between two mesas, wherein the isolated trench is substantially orthogonal to the line features, and wherein a line of a plurality of vias are formed at intersections of the isolated trench and the plurality of trenches.

Further to the first embodiments, the pattern layer comprises a plurality of second trenches interspersed among a plurality of second line features, wherein the plurality of second line features are substantially orthogonal to the line features, and wherein a plurality of vias are formed at intersections of the plurality of trenches and the plurality of second trenches.

Further to the first embodiments, the pattern layer comprises a grid of staggered blocks within the plurality of trenches, and wherein a plurality of lines of vias are formed between the staggered blocks and within the plurality of trenches such that a first line of vias and a second line of vias of the plurality of vias have an offset therebetween.

Further to the first embodiments, the pattern layer comprises at least one of a grid of aligned blocks within at least some of the plurality of trenches, a plurality of lines of vias being formed between the aligned blocks and within the plurality of trenches, an isolated trench between two mesas, the isolated trench being substantially orthogonal to the line features, and a line of a plurality of second vias being formed at intersections of the isolated trench and the plurality of trenches, a plurality of second trenches interspersed among a plurality of second line features, the plurality of second line features being substantially orthogonal to the line features, and a plurality of third vias being formed at intersections of the plurality of trenches and the plurality of second trenches, or a grid of staggered blocks within the plurality of trenches, a plurality of lines of third vias being formed between the staggered blocks and within the plurality of trenches such that a first line of vias and a second line of vias of the plurality of third vias have an offset therebetween.

In one or more second embodiments, a method comprises transferring a pattern to a hardmask layer to form a hardmask grating pattern having a plurality of trenches interspersed among a plurality of line features on a device layer, disposing a resist layer over the hardmask grating pattern, exposing the resist layer with extreme ultraviolet radiation to generate an enhanced exposure portion of the resist layer within at least one trench of the hardmask grating pattern, and developing the resist layer to form a pattern layer having at least a pattern structure on the device layer and within the least one trench of the grating pattern.

Further to the second embodiments, the hardmask grating pattern comprises at least one of an oxide, a nitride, a carbide, a silicide, a metallic oxide, or a metallic nitride.

Further to the second embodiments, the pattern layer comprises a grid of aligned blocks within the plurality of trenches, and wherein a plurality of lines of vias are formed between the aligned blocks and within the plurality of trenches.

Further to the second embodiments, the pattern layer comprises an isolated trench between two mesas, wherein the isolated trench is substantially orthogonal to the line features, and wherein a line of a plurality of vias are formed at intersections of the isolated trench and the plurality of trenches.

Further to the second embodiments, the pattern layer comprises at least one of a grid of aligned blocks within the plurality of trenches, a plurality of lines of vias being formed between the aligned blocks and within the plurality of trenches or an isolated trench between two mesas, the isolated trench being substantially orthogonal to the line features, and a line of a plurality of second vias being formed at intersections of the isolated trench and the plurality of trenches.

In one or more third embodiments, a device structure comprises a grating pattern having a plurality of trenches interspersed among a plurality of line features on a device layer, a pattern layer disposed over the grating pattern and the device layer, wherein the pattern layer comprises a plurality of pattern structures having one or more gaps therebetween, and vias at intersections of the plurality of trenches and the one or more gaps, wherein the vias have a pattern fidelity and wherein the vias comprise a sub-resolution feature size.

Further to the third embodiments, the sub-resolution feature size comprises a feature size not greater than 20 nanometers.

Further to the third embodiments, the sub-resolution feature size comprises a feature size sub-resolution to a feature of similar shape printed on a flat substrate using 193 nm lithography or EUV lithography.

Further to the third embodiments, the sub-resolution feature size comprises a feature size sub-resolution to a 40 nanometer half-pitch.

Further to the third embodiments, the sub-resolution feature size comprises at least one of a feature size not greater than 20 nanometers, a feature size sub-resolution to a feature of similar shape printed on a flat substrate using 193 nm lithography or EUV lithography, or a feature size sub-resolution to a 40 nanometer half-pitch.

Further to the third embodiments, the pattern structures comprise a first and second mesa and the one or more gaps comprise a isolated trench between the first and second mesas, and wherein the vias comprise a line of nested vias.

Further to the third embodiments, the pattern structures comprise an array of line features and the one or more gaps comprise a plurality of trenches interspersed among the line features, and wherein the vias comprise a grid of vias.

Further to the third embodiments, the pattern structures comprise a grid of aligned blocks and the one or more gaps comprise a gap between and among the grid of aligned blocks, and wherein the vias comprise a plurality of lines of nested vias.

Further to the third embodiments, at least one of the pattern structures comprise a first and second mesa and the one or more gaps comprise a isolated trench between the first and second mesas, and the vias comprise a line of nested vias, the pattern structures comprise an array of line features and the one or more gaps comprise a plurality of trenches interspersed among the line features, and the vias comprise a grid of vias, or the pattern structures comprise a grid of aligned blocks and the one or more gaps comprise a gap between and among the grid of aligned blocks, and the vias comprise a plurality of lines of second nested vias.

It will be recognized that the invention is not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

The invention claimed is:

1. A method comprising:
disposing a grating pattern having a plurality of trenches interspersed among a plurality of line features on a device layer;
disposing a resist layer over the grating pattern and on the device layer, wherein a top surface of the resist layer is above each top surface of each of the line features;
exposing the resist layer with non-reflecting radiation to generate first and second enhanced exposure portions of the resist layer both within at least one trench of the grating pattern, wherein the first trench is between first and second line features of the grating pattern;
developing the resist layer to form a pattern layer having first and second pattern structures corresponding to the first and second enhanced exposure portions and a via exposing the device layer and extending between the first and second line features and between the first and second pattern structures on the device layer and within the least one trench of the grating pattern; and transferring a pattern defined by the pattern layer to the device layer.

2. The method of claim 1, wherein exposing the resist layer with non-reflecting radiation comprises exposing the resist layer with at least one of extreme ultraviolet radiation or electron-beam radiation.

3. The method of claim 1, wherein exposing the resist layer with non-reflecting radiation comprises exposing the resist layer with electromagnetic radiation having a wavelength of not more than 120 nm.

4. The method of claim 1, wherein the grating pattern comprises at least one of a second resist, an oxide, a nitride, a carbide, a silicide, a dielectric, a metallic oxide, or a metallic nitride.

5. The method of claim 1, wherein the first line feature of the plurality of line features comprises a first material and the second line feature of the plurality of line features comprises a second material different than the first material.

6. The method of claim 1, wherein exposing the resist layer comprises exposing a third portion of the resist layer that is adjacent to the at least one trench and over the first line feature and wherein the first pattern structure is fully aligned with a sidewall of the first line feature adjacent to the at least one trench.

7. The method of claim 1, wherein a third portion of the resist layer within the at least one trench and adjacent to a sidewall of the first line feature is not fully exposed during said exposing the resist layer, and wherein the first pattern structure is fully aligned with a sidewall of the first line feature adjacent to the at least one trench.

8. The method of claim 1, wherein the grating pattern comprises at least one of rows of the plurality of trenches interspersed among rows of the plurality of line features or the plurality of trenches interspersed among intersecting regions of the plurality of line features.

9. The method of claim 1, wherein disposing the grating pattern on the device layer comprises at least one of forming the grating pattern via 193 nm lithography or transferring a pattern to a hardmask layer to form the grating pattern.

10. The method of claim 1, wherein disposing the grating pattern on the device layer comprises:

forming a second grating pattern having a plurality of second trenches interspersed among a plurality of third line features on the device layer;

disposing a conformal layer over the second grating pattern;

performing an anisotropic etch of the conformal layer to form sidewall spacers adjacent to the third line features; and removing the third line features to form the grating pattern having the plurality of line features comprising the sidewall spacers.

11. The method of claim 1, wherein the pattern layer comprises a grid of aligned blocks within at least some of the plurality of trenches, and wherein a plurality of lines of second vias are formed between the aligned blocks and within the plurality of trenches.

12. The method of claim 1, wherein the pattern layer comprises an isolated trench between two mesas, wherein the isolated trench is substantially orthogonal to the line features, and wherein a line of a plurality of second vias are formed at intersections of the isolated trench and the plurality of trenches.

13. The method of claim 1, wherein the pattern layer comprises a plurality of second trenches interspersed among a plurality of third line features, wherein the plurality of third line features are substantially orthogonal to the line features, and wherein a plurality of second vias are formed at intersections of the plurality of trenches and the plurality of third trenches.

14. The method of claim 1, wherein the pattern layer comprises a grid of staggered blocks within the plurality of trenches, and wherein a plurality of lines of second vias are formed between the staggered blocks and within the plurality of trenches such that a first line of vias and a second line of vias of the plurality of second vias have an offset therebetween.

15. A method comprising:

transferring a pattern to a hardmask layer to form a hardmask grating pattern having a plurality of trenches interspersed among a plurality of line features on a device layer;

disposing a resist layer over the hardmask grating pattern and on the device layer, wherein a top surface of the resist layer is above each top surface of each of the line features;

exposing the resist layer with extreme ultraviolet radiation to generate first and second enhanced exposure portions of the resist layer both within at least one trench of the hardmask grating pattern, wherein the first trench is between first and second line features of the grating pattern;

developing the resist layer to form a pattern layer having first and second pattern structures corresponding to the first and second enhanced exposure portions and a via exposing the device layer and extending between the first and second line features and between the first and second pattern structures on the device layer and within the least one trench of the grating pattern; and transferring a pattern defined by the pattern layer to the device layer.

16. The method of claim 15, wherein the hardmask grating pattern comprises at least one of an oxide, a nitride, a carbide, a silicide, a metallic oxide, or a metallic nitride.

17. The method of claim 15, wherein the pattern layer comprises a grid of aligned blocks within the plurality of trenches, and wherein a plurality of lines of second vias are formed between the aligned blocks and within the plurality of trenches.

18. The method of claim 15, wherein the pattern layer comprises an isolated trench between two mesas, wherein the isolated trench is substantially orthogonal to the line features, and wherein a line of a plurality of second vias are formed at intersections of the isolated trench and the plurality of trenches.

* * * * *